(12) United States Patent
Schwab et al.

(10) Patent No.: US 9,433,110 B2
(45) Date of Patent: Aug. 30, 2016

(54) LID ELEMENT AND HOUSING DEVICE FOR USING THE LID ELEMENT

(71) Applicant: HKR Seuffer Automotive GmbH & Co. KG, Kupferzell (DE)

(72) Inventors: Oliver Schwab, Kupferzell (DE); Wolfgang Bass, Kupferzell (DE)

(73) Assignee: HKR Seuffer Automotive GmbH & Co. KG (DE)

( * ) Notice: Subject to any disclaimer, the term of this patent is extended or adjusted under 35 U.S.C. 154(b) by 0 days.

(21) Appl. No.: 14/552,727

(22) Filed: Nov. 25, 2014

(65) Prior Publication Data

US 2015/0145390 A1 May 28, 2015

(30) Foreign Application Priority Data

Nov. 26, 2013 (DE) .................. 20 2013 010 641 U

(51) Int. Cl.
| | | |
|---|---|---|
| H01L 21/00 | (2006.01) | |
| H05K 5/00 | (2006.01) | |
| H01L 21/673 | (2006.01) | |
| H01L 21/687 | (2006.01) | |
| H05K 5/06 | (2006.01) | |
| H05K 5/02 | (2006.01) | |

(52) U.S. Cl.
CPC ........... *H05K 5/0013* (2013.01); *H01L 21/673* (2013.01); *H01L 21/67333* (2013.01); *H01L 21/687* (2013.01); *H05K 5/0004* (2013.01); *H05K 5/0052* (2013.01); *H05K 5/0213* (2013.01); *H05K 5/0217* (2013.01); *H05K 5/061* (2013.01)

(58) Field of Classification Search
CPC ........... H01L 21/67333; H01L 21/673; H01L 21/687
See application file for complete search history.

(56) References Cited

U.S. PATENT DOCUMENTS

| 2014/0090969 A1* | 4/2014 | Uitto | H01H 1/2041 |
| | | | 200/571 |
| 2014/0160698 A1* | 6/2014 | Farquhar | H05K 5/0208 |
| | | | 361/752 |

FOREIGN PATENT DOCUMENTS

| DE | 1 195 829 | 7/1965 |
| DE | 295 06 698 U1 | 8/1995 |
| DE | 44 33 861 A1 | 3/1996 |
| DE | 197 42 496 C1 | 2/1999 |
| DE | 199 42 949 C1 | 8/2001 |
| DE | 198 02 363 C2 | 4/2002 |
| EP | 0 148 765 A2 | 7/1985 |
| EP | 0971 572 A1 | 1/2000 |
| FR | 2 941 129 A1 | 7/2010 |
| WO | WO 99/54973 | 10/1999 |

OTHER PUBLICATIONS

German Search Report with partial translation issued in related German Application No. DE 20 2013 010 641.7, dated Dec. 13, 2013.

* cited by examiner

*Primary Examiner* — Ngan Ngo
(74) *Attorney, Agent, or Firm* — RatnerPrestia

(57) ABSTRACT

A lid element which can be connected to a further housing part for closing an opening in the housing part is formed in one piece as a molded part. The lid element includes a base plate on which several lugs are formed which extend from the base plate. The lugs are arranged on the base plate relative to the housing part in such a manner that the lugs, when the housing part and the lid element are put together, extend into indentations provided in the housing part after they have been plastically bent toward the housing part.

10 Claims, 2 Drawing Sheets

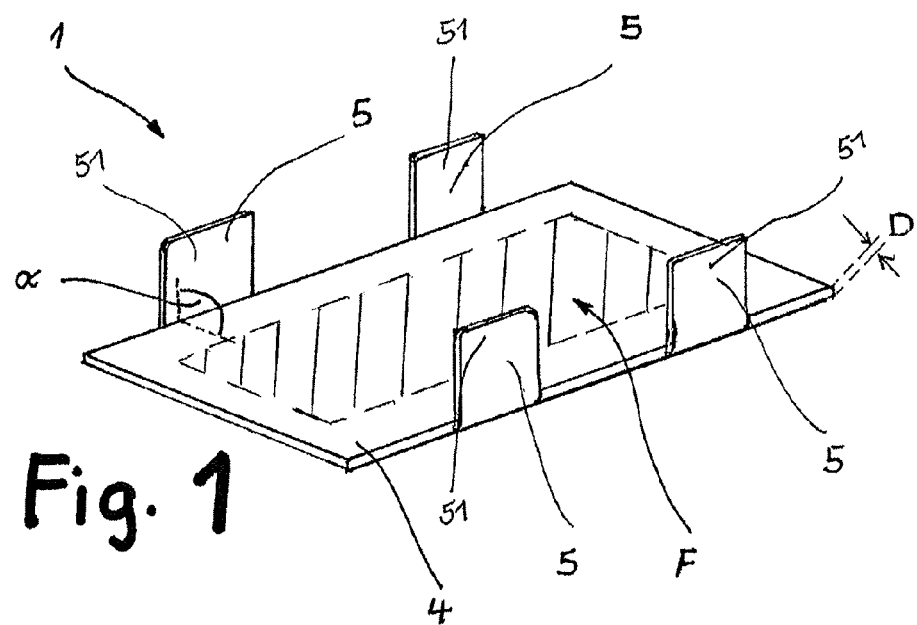
Fig. 1
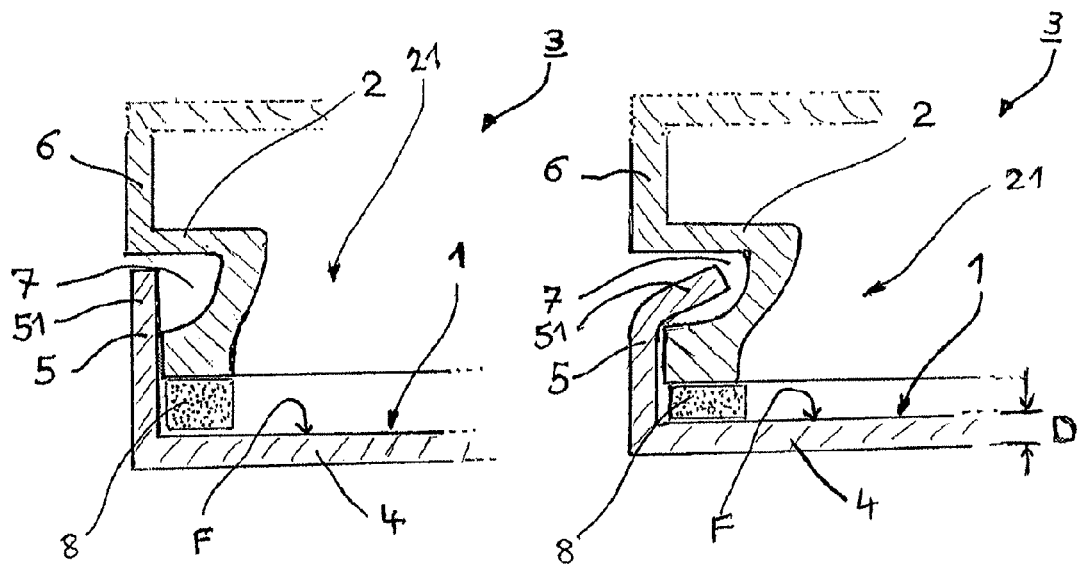
Fig. 2
Fig. 3

Cross Section A-A

LID ELEMENT AND HOUSING DEVICE FOR USING THE LID ELEMENT

RELATED APPLICATIONS

This application claims the benefit of priority under 35 U.S.C. §119 of German Application DE 20 2013 010 641.7, filed Nov. 26, 2013, the content of which is incorporated by reference herein in its entirety and for all purposes.

FIELD

The present invention relates to a lid element and in particular a lid element formed as a molded part and intended for covering a housing part, as well as to a housing device for using the lid element.

BACKGROUND

In technical or basically industrial applications, there is the need to arrange electric, electronic or other members in a housing device (in the following simply referred to as a "housing"), so that the members and components arranged in the housing are protected against external influences, on the one hand, and on the other hand to allow the installation of the members and components in the housing and to arrange them together with the housing as an independently producible module in another machine or any other facility. Here, the module which may be prefabricated for the further application can be installed in one piece at the place of use, so that the manufacture as well as the assembly of the module at the place of use are simplified, so that costs can be kept low.

If electric or electronic members and any other components are arranged in a housing of this type, for example, it is essential that the housing is mechanically stable on the one hand and sealed off perfectly on the other hand, so that—in case of harsh environmental conditions such as in an industrial machine or in a motor vehicle—no dirt can reach the interior of the housing, as otherwise there is the risk that members are damaged or the entire function is impaired. To this end, housings are realized in a known manner in a multi-part design, wherein elastic seals are generally provided between the several parts of the housing. The effect of the sealing depends on the fact that the housing parts lie on top of each other in a proper manner and are pressed against each other with a predetermined pressure, so that the elastic seal is able to fulfill its function by making contact with the respective housing parts.

To this end, flange connections are used together with corresponding screws, the latter allowing to adjust a proper compression of the seals, resulting in a reliable sealing of the housing.

Further, there is the possibility to provide latching or clip connections in which the housing parts are assembled to form an overall housing. By exerting a slight pressure during assembling, the individual elements of the latching connection can latch in place and hence reliably connect the housing, on the one hand, and produce a predetermined pressure on the other hand, so that the sealing is ensured.

Figure 4:
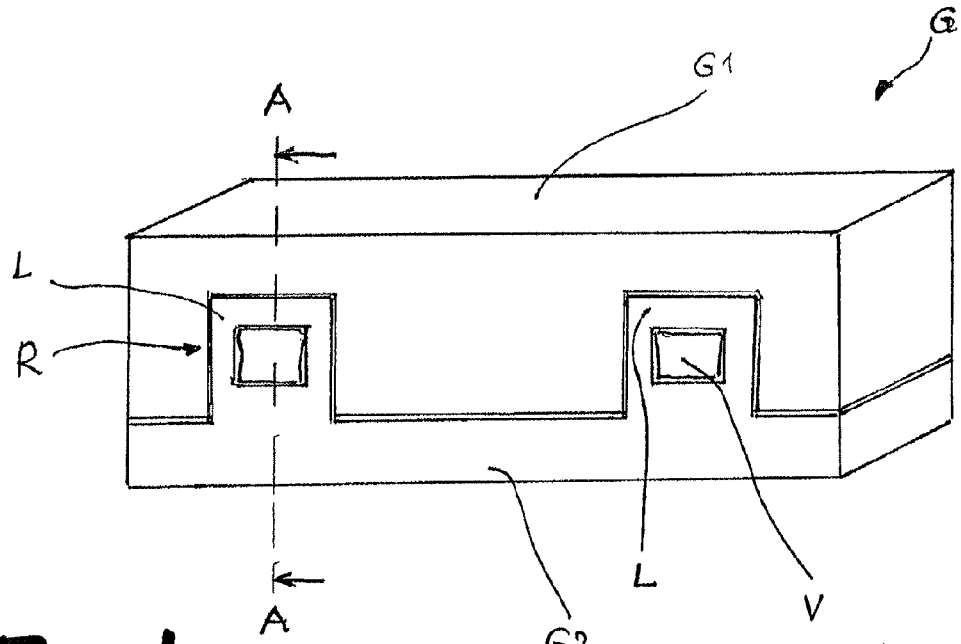

FIG. 4 shows a known arrangement in which an overall housing G consists of an upper element G1 and a lower element G2. The upper element G1 and the lower element G2 are inserted into each other for forming the overall housing G, and both housing parts G1 and G2 comprise mutually corresponding latching elements. Especially the lower housing element G2 comprises lugs L latching in place on latching protrusions R of the upper housing element G1 and hence establishing a form-fit connection.

Figure 5:
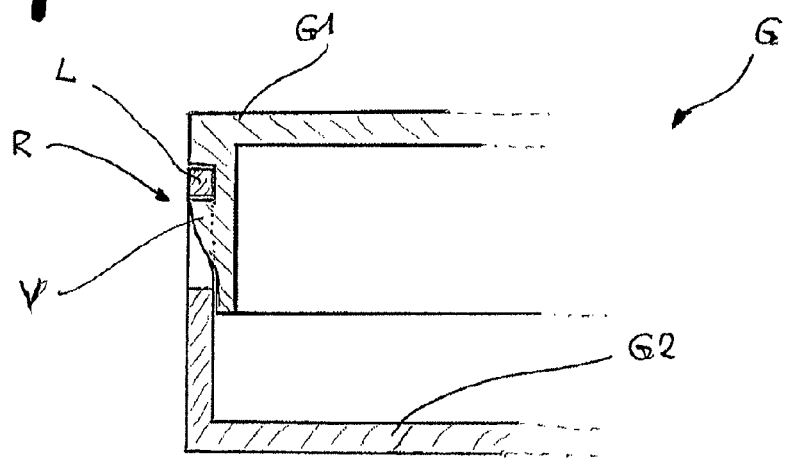

During making the connection, i.e. during assembling the upper housing element G1 and the lower housing element G2 for forming the overall housing G, the two housing elements have to be put together with a predetermined force, so that the desired latching connection can be achieved. In doing so, a seal not shown in the Figures but arranged therebetween is compressed in excess. FIG. 4 shows the arrangement of the overall housing G in the mounted state, whereas FIG. 5 shows the arrangement according to FIG. 4 in the mounted (assembled) state in connection with a sectional illustration along sectional line A-A according to FIG. 4. The latching protrusion V of the latching connection R is latched in place, so that the upper part of the lug L of the lower housing element G2 is connected to the latching protrusion V of the upper housing element G1 in a form-fitting manner. Here, it is required to consider the more complex construction of the individual elements for establishing the latching connection, and a defined force for assembling the two housing elements G1 and G2 (i.e. during assembly) is also required.

In this context, document FR 2 941 129 shows a part of a housing in which a lid element comprises lugs which are intended for being joined with a further part of the housing and comprise a latching opening, so that, having assembled the lid element and the further housing part, corresponding latching protrusions of the further housing part can latch in place in the openings of the lid element. In this way, the latching connection guarantees a firm fit between the lid element and the further housing part. The housing may serve for accommodating members, functional elements or circuits in the automotive sector.

It is required here to press the lid element and the at least one further housing part against each other during assembly, so that in connection with the elasticity of the housing parts and of an intermediate elastic seal the respective latching elements are able to latch in place. After a relaxation or release of the mounted elements, there will be a firm fit of the housing parts on top of each other in connection with the elasticity of the housing parts, the elasticity of the seal and the retaining effect provided by the latching elements.

In the known arrangements mentioned above, a respective housing comprising corresponding housing parts is implemented in a multi-part design and manufactured by corresponding molding processes (generally in connection with a plastic injection molding process) or in any other way. In each case, a more complex assembly procedure is required, and elastic or resilient materials for producing the housing parts are required, too.

Therefore, the present invention is based on the object to form a lid element of the type initially mentioned as well as a housing device in such a manner that at least one housing part for forming the housing device can be effectively and permanently assembled with simple measures by means of the lid element and the lid element can also be produced in a simple and cost-effective fashion.

SUMMARY

According to the invention, this object is achieved by means of a lid element as well as a housing device using such a lid element.

Thus, the present invention relates to a lid element which can be connected to a further housing part for closing an opening in the housing part, wherein the lid element is formed in one piece as a molded part, the lid element comprises a base plate on which several lugs are formed which extend from the base plate, and the lugs are arranged on the base plate relative to the housing part in such a manner that the lugs, when the housing part and the lid element are put together, extend into indentations provided in the housing part after they have been plastically bent toward the housing part.

The invention also relates to a housing device for accommodating functional elements in its interior, comprising a housing part having one side provided with an opening for accommodating the functional elements, the opening being closed with the lid element.

The lid element's arrangement according to the invention allows to completely close the housing part which is connected to the lid element, with the space formed in the interior of the housing part and the lid element being perfectly sealed off with respect to the ingress of dirt and moisture. The lid element can be connected with the housing part in simple manner by bending lugs provided on the lid element (at an edge thereof), so that after assembly when the respective lugs have been correspondingly bent (plastic bending), the latter ensure a reliable and firm connection between the two elements; even under the influence of external mechanical forces, oscillations and vibrations, a reliable fit of the components of the housing device and an effective sealing of the housing device are ensured. The lid element is preferably made in one piece as a molded part and comprises the above-mentioned lugs which when assembled with the housing part are bent toward the housing part and connect the housing part and the lid element in a form-fitting manner.

In this way, the components of the housing device, i.e. the housing part and the lid element, can be connected to each other in an easy way, so that a reliable, permanent and sealed connection between the components the housing device is produced.

Thus, the lid element according to the present invention may contribute to several functions; on the one hand, this concerns the perfect sealing of the housing device after having attached the lid element to the housing part. Further, a damping of mechanic oscillations or vibrations is achieved by improving the stability of the housing device as a whole. A complex process of fully or partially potting any parts of the housing device as well as the manufacture of complex latching elements are not necessary. This ensures a cost-effective manufacture of the entire housing device including the housing part and the lid element. If the lid element is made of a metallic and hence heat-conducting material, the lid element may also serve as a heat sink for heat-emitting units. In conjunction with the form-fit connection between the lid element and the housing part, said heat-emitting units are elastically pressed against the lid element.

With the lid element, the lugs extending away from the base plate may be fully or partially bent toward the housing part and may project into the indentations of the housing part with a distal part of the lugs in the nature of a form-locking connection.

The individual lugs among the plurality of lugs may have the same or differing dimensions, and the lid element may be made of sheet metal.

The base plate of the lid element may comprise a functional area for arranging functional elements, and an annular sealing element may be arranged on the base plate around the functional area.

The functional elements may comprise heat-emitting units, and said heat-emitting units within the functional area can be pressed against the lid element for the purpose of heat dissipation when the lid element and the housing part are in the assembled state.

With the lid element, the sealing element may be arranged on the base plate such that the sealing element is pressed against the base plate when the lid element is connected to the housing part.

In the housing device, the lugs of the lid element may be formed such that they each have a distal part, said distal part after bending being permanently arranged in the indentations of the housing part for establishing a form-fit connection.

An interior space for accommodating functional elements may be formed between the lid element and the housing part, and the functional elements may comprise heat-emitting units within the functional area which are pressed against the lid element for the purpose of heat dissipation when the lid element and the housing part are in the assembled state.

BRIEF DESCRIPTION OF THE DRAWING FIGURES

The present invention is explained in more detail below on the basis of exemplary embodiments with reference to the drawings in which:

FIG. 1 is a simplified perspective illustration of the lid element according to the present invention, FIG. 2 shows a partial cross-sectional view of the housing device including the lid element in the mounted, but not yet fastened state, FIG. 3 shows a partial cross-sectional view of the housing device including the lid element in the completely mounted state, FIG. 4 shows a simplified schematic overall view of a known housing device comprising a latching connection, and FIG. 5 shows a cross-sectional view along line A-A of FIG. 4 for illustrating the known latching connection of the housing arrangement.

DETAILED DESCRIPTION

The present invention is described in the following on the basis of the illustration in FIGS. 1 to 3.

FIG. 1 shows a simplified and perspective illustration of a lid element 1 which is provided to be connected with a (further) housing part 2, not shown in FIG. 1 in order to simplify the illustration, for forming a housing device 3. Thus, the housing device 3 essentially consists of the lid element 1 which is attached to the housing part 2 in such a manner that e.g. an opening in the housing part 2 at the top, bottom or at the sides of the housing part 2 is closed in a mechanically reliable manner, on the one hand, and sealed off with a permanent sealing, on the other hand.

According to FIG. 1, the lid element 1 is schematically illustrated in simplified manner in the form of a planar plate; the lid element 1, however, may also have a contour deviating therefrom. In particular, the lid element 1 comprises a functional area F which is arranged substantially in a central part of the lid element 1 and on which various mechanic and electric members and components as well as electric circuit boards may be arranged. The functional area F, for simplification of the illustration being shown with regular dimensions, may also have an irregular areal shape which may conform to the irregular shape of the housing part 2. What is more, the functional area F of the lid element 1 may be provided with indentations or raised portions which are formed depending on the place and the type of units and components placed on the lid element in the functional area F.

FIG. 1 further shows the base plate 4 of the lid element 1 in a rectangular shape, but the present invention is not limited to a rectangular shape, or basically a regular shape, and the base plate 4 of the lid element 1 may also have an irregular shape which partially depends on the units and components to be arranged in the housing device 1 and on the external shape of the housing part 2 with which the lid element 1 can be connected to form the housing device 3, as well as on the spatial conditions at the installation site of the housing device 3.

The lid element 1 according to FIG. 1 further comprises several lugs 5; by way of example, four of them are shown in FIG. 1, and they are formed in one piece with the base plate 4 preferably in a peripheral area of the latter in such a manner that they extend substantially perpendicular to the base plate (in FIG. 1) to the top and toward the housing part 2 to be attached. The present invention is not limited to the number of four lugs 4; rather, it is possible to choose a higher or smaller number of lugs 5.

It is preferred that the lugs 5 are arranged in such a way that there is an angle α of approximately 90° relative to the base plate 4, with the option that the angle α may also be slightly larger or smaller than 90°. With respect to an easy assembly, the angle α may also amount to 90° and up to 120°, for instance. The angle α is schematically illustrated in FIG. 1 with reference to one of the lugs 5 between the respective lug 5 and the base plate 4. If the angle α is larger than 90°, it is possible for reasons of manufacturing technology (for an easier assembly, for example) to bend the lugs slightly in outward direction (i.e. by the amount of the angle α which is larger than 90°), i.e. away from the base plate 4.

For simplifying the illustration in FIG. 2 and regardless of possible manufacturing tolerances, an angle α of approximately 90° has been chosen.

In this context, FIG. 2 shows a cross-sectional view of the base plate 12 in the region of a lug 5, when the housing part 2 is placed on the lid element 1 for forming the housing device 3, or the lid element 1 is attached on the housing part 2 according to the designated use.

If the housing part 2 is placed on the lid element 1 (according to FIGS. 1 and 2) from above, if the illustration of the lid element 1 of FIG. 1 is viewed, for example, the lugs 5 are arranged in the region of side walls 6 of the housing part 2 which is partially indicated in FIGS. 2 and 3. The side walls 6 of the housing part 2 comprise indentations 7 substantially in the region where one of the lugs 5 of the lid element 1 is situated after the attaching or assembly process; said indentations are formed such that they provide a space from the outer side of the housing part 2 toward the inner side of the housing part 2. In FIGS. 2 and 3, the respective indentation is shown, extending from the outer side of the side walls 6 toward the interior of the housing part 2. FIG. 2 shows, similar to FIG. 3, an opening 21 which is provided in the interior of the housing part 2 and defines an interior space for accommodating the functional elements (members and components) arranged on the base plate 4 of the lid element 1 in the functional area F; thus, said functional elements may protrude from the functional area F into the space in the interior of the housing part 2.

FIG. 2 shows the situation when the lid element 1 and the housing part 2 are assembled. The respective lug 5 is located partially in the region of the indentation 7, in particular in front of it. Specifically, a distal part 51 of a respective lug 5 is disposed in the region of the indentation 7 or adjacent to the latter.

FIG. 3 shows the situation after the final assembly of lid element 1 and housing part 2; here, the respective lug 5 or at least a part of it, i.e. at least the distal part 51, has been bent toward the indentation 7 and thus toward the attached housing part 2, so that the lug 5 having a limited width protrudes into the indentation 7 which has a somewhat larger width, establishing a reliable form-fitting connection between the lid element 1 and the housing part 2 by the lug 5 or at least the distal part 51 of a respective lug 5 being able to rest against the housing part 2 also within the indentation 7.

According to the illustration in FIG. 3, it can be seen that—depending on the configuration of the indentation 7—a predetermined larger or smaller part of the lug 5 (at least the distal part 51) in its upper region, i.e. in its region remote from the base plate 4, is bent into the indentation 7, so that the bent region of the lug 5 establishes the desired form-fitting and stabile connection with the housing part 2 in combination with the indentation 7. In this way, the firm connection between the lid element 1 and the housing part 2 is achieved, and a sealing element 8 is preferably arranged between the lid element 1 and the housing part 2, so that a circumferential seal is formed along the entire circumference where the housing part 2 would contact the lid element 1 after having been joined with the lid element 1; after the final assembly and especially after having bent (plastic bending) at least a part of the lug 5 toward the indentation 7, said seal exerts a slight pressure on the sealing element 8, so that the thorough sealing effect of the sealing element 8 is produced and ensured.

The sealing element 8 is shown in FIGS. 2 and 3 as a one-piece sealing element, extending along the outer edge of the base plate 4 between the outer edge of the base plate 4 and the beginning of the functional areas F with reference to FIG. 1. The invention, however, is not restricted to a one-piece sealing element 8 as shown in FIGS. 2 and 3; rather, the sealing element 8 may also have other cross-sectional areas and areal shapes and may also be formed from the same or different materials in a multi-part design.

The arrangement, according to the invention, of the housing device 3 in connection with the lid element 1 and the housing part 2 as well as the lugs 5 of the lid element 1, which are situated in the indentations of the housing part 2 in a form-fitting manner after the plastic bending, results in a simplified manufacture as the assembly of the lid element 1 and the housing part 2 may be performed with only a slight force due to the fact that latching elements or clip connections are not used. In the assembled state of the housing device 3, it is possible in a simple manner by way of a production process to bend the parts (which are to be bent, i.e. to be deformed plastically) of the lugs 5 (distal part 51) in the corresponding way toward the indentation 7 of the housing part 2, so that a firm and in particular form-fitting connection is produced and the two parts of the housing device 3 are sealed by means of the intermediate sealing element 8, so that a reliable protection against dirt or moisture is ensured together with a long-term stable fit. In this arrangement, the sealing element 8 is not excessively stressed, as the measure of bending (plastically bending) the lugs 5 toward the indentation 7 has the effect that the housing part 2 rests against the sealing element 8 only with a slight, but sufficient pressure, without the sealing element 8 being compressed too much as it is required if a latching connection according to FIGS. 4 and 5 is used.

If a latching or clip connection is used as it is shown in FIGS. 4 and 5, it is required to establish the form-fit connection (which is made possible by the latching process) by pressing the attached housing part downward according to FIG. 4 with a somewhat larger force, so that the seal between the housing part and the lid element is subjected to greater mechanical stress. In any case, the individual parts require a more complex manufacturing process and also the assembly involves increased efforts in case the known latching connection is used.

FIG. 1 shows the lugs 5 of the lid element 1 as rectangular planar parts. The invention, however, is not limited to this design, and the several lugs 5 may be implemented in another way in terms of their width and height (in the direction of extension away from the base plate 4) as well as their shape which may deviate from the rectangular shape shown to simplify the illustration. The dimensions of the lugs 5 may depend on the design of the housing part 2, i.e. on the dimensions of the housing part 2. It is also possible to arrange the several lugs 5 along the outer circumference of the base plate 4 as desired, as far as a reliable fastening of the lid element 1 on the housing part 2 is ensured. Specifically, the indentations 7 in the housing part 2 depend on the shape and the dimensions of the lugs 5, and vice versa.

An inner space (interior space) is formed in the interior of the housing device 3 between the lid element 1 and the housing part 2, said inner space being suitable for accommodating any units within the functional area F. In this connection, it is possible to arrange various mechanical and electric (as well as electronic) units according to the above details, including a corresponding circuit board on which the units are arranged. The arrangement of the housing device 3 allows to fix the respective units (basically functional elements) or a circuit board (arranged in the housing device 3 and not shown in the Figures for the sake of simplification) in the functional area F according to FIG. 1 in their respective positions after assembly of the lid element 1 and the housing part 2, so that the members arranged in the housing device 3, apart from the required electric connections, are reliably fixed in the housing device 3 also in mechanical respects. To this end, corresponding elastic elements may be provided in the interior of the housing device 3, which provide for a reliable and at the same time elastic support and fixation of units and circuit boards. Specifically, the electric and/or mechanical members and one or more circuit boards can be elastically supported in the functional area F by means of corresponding damping elements, so that smaller forces act on the components regardless of any larger external forces.

In connection with elastic elements for resiliently supporting or holding the units and (also mechanical) components (basically functional elements) in the interior space between the lid element 1 and the housing part 2, the lid element 1 (which is made from sheet metal, for example) may also serve as a heat sink if heat-emitting units are pressed against the lid element 1 by means of the elastic elements for the purpose of dissipating heat. To this end, the respective heat-emitting units (such as power transistors and capacitors) are arranged in predetermined positions or areas of the lid element 1 (within the functional area F), and the housing part 2 has its inner surface formed such that the respective units are mechanically retained, on the one hand, and pressed against the lid element 1 with a defined pressure on the other hand, so that there is a sufficient contact between the units and the lid element in order to ensure a good heat removal (i.e. heat transfer to the lid element 1). Thus, the lid element further has the function of a heat sink.

In the assembled state of the lid element 1 and the housing part 2 and in connection with elastically compressing the sealing element 8 and due to the form-fit connection between lid element 1 and housing part 2 by means of the lugs 5, it is possible to achieve and ensure the compression forces for pressing the sealing element 8 as well as the heat-emitting units against the lid element 1.

To this end, the lid element 1 is made of a heat-conducting material, such as of a sheet metal with a predetermined thickness D, as indicated in FIGS. 1 and 3. The extension of the lid element 1 (surface area of the base plate 4 including the several lugs 5) allows to achieve a good heat removal. The lid element 1 may be realized as a molded part preferably in one piece, and the configuration of the functional area F may further comprise corresponding indentations for respective units or other components. Corresponding indentations and raised portions of the molded part of the lid element 1 are able to improve the mechanical stability of the lid element 1 (especially with regard to bending or torsion).

The sheet metal of the lid element 1 may be a steel plate with a predetermined thickness D in the range from approximately 0.5 mm to approximately 5 mm, preferably in the range from approximately 2 mm to 3 mm. As an alternative, the sheet metal may consist of an aluminum alloy having a higher thermal conductivity in terms of the function of the lid element 1 as a heat sink.

The construction and the mode of operation which have been described above allow to use the housing device 3 in industrial machines or for instance in motor vehicles where there are tough conditions with respect to the exposure to dirt and moisture, on the one hand, and where oscillations, shocks and vibrations exert considerable mechanical forces (i.e. external forces) on the housing device 3 and hence on the members arranged in the housing device 3, on the other hand. Thus, the housing device 3 according to the above description is highly suitable for use in industrial machines and especially in motor vehicles with unfavorable ambient conditions and mechanical stresses. By way of example, the housing device 3 may be designed for accommodating a circuit board equipped with electronic components which are provided for the power control of members in the motor vehicle or industrial machine, for instance for controlling electric motors associated to fans.

The lid element 1 may also be formed from an elastic but firm plastic material by a corresponding plastic injection molding process, allowing only a low heat removal level. If the lid element 1 is made of a metallic material, for instance made of the above-mentioned sheet metal having the predetermined thickness D, the lid element 1 may be formed by a punching process. Depending on the type and the placement of the units, the mentioned raised portions and indentations may be formed in the functional area F, for accommodating the respective units and components as well as elastic damping elements. Moreover, the sealing element 8 may also be arranged in a corresponding annular indentation extending along the outer circumference of the base plate 4 (between the edge of the functional area F and the edge of the base plate 4), so that the sealing element 8 can be prevented from getting displaced during assembly, i.e. during assembling the lid element 1 and the housing part 2.

The present invention has been described in more detail on the basis of exemplary embodiments with reference to the Figures. A person skilled in the art, however, will appreciate that the configuration of the present invention according to the described Figures and the members and components set forth in the Figures and the description as well as the further exemplary details are not be interpreted in a limiting sense. The invention is not limited to the specified illustrations in the Figures, especially not limited to dimensions and arrangements. All those embodiments and variants are deemed to be included in the invention which come under the appended protective claims.

The invention claimed is:

1. A lid element which can be connected to a further housing part for closing an opening in the housing part, wherein:
   the lid element is formed in one piece as a molded part,
   the lid element comprises a base plate on which a plurality of lugs are formed which extend from the base plate, and
   the plurality of lugs are arranged on the base plate relative to the housing part in such a manner that the plurality of lugs, when the housing part and the lid element are put together, extend into indentations provided in sidewalls of the housing part after the plurality of lugs have been plastically bent toward the housing part, the plurality of lugs extending into the sidewalls to secure the lid element to the housing part,
   wherein the base plate of the lid element comprises a functional area for arranging functional elements, and an annular sealing element is arranged on the base plate around the functional area,
   the sealing element being arranged on the base plate such that the sealing element is pressed against the base plate when the lid element is connected to the housing part.

2. The lid element according to claim 1, wherein the plurality of lugs are fully or partially bent toward the housing part and project into the indentations of the housing part with a distal part of each of the plurality of lugs in the nature of a form-locking connection.

3. The lid element according to claim 1, wherein individual lugs among the plurality of lugs have the same or differing dimensions.

4. The lid element according to claim 1, wherein the lid element is made of sheet metal.

5. The lid element according to claim 1, wherein the functional elements comprise heat-emitting units, said heat-emitting units within the functional area being pressed against the lid element for the purpose of heat dissipation when the lid element and the housing part are in an assembled state.

6. A housing device for accommodating functional elements in its interior, comprising:
   a housing part having one side provided with an opening for accommodating the functional elements, and
   a lid element which can be connected to the housing part for closing the opening in the housing part, wherein,
   the lid element is formed in one piece as a molded part,
   the lid element comprises a base plate on which a plurality of lugs are formed which extend from the base plate, and
   the plurality of lugs are arranged on the base plate relative to the housing part in such a manner that the plurality of lugs, when the housing part and the lid element are put together, extend into indentations provided in sidewalls of the housing part after they have been plastically bent toward the housing part, the plurality of lugs extending into the sidewalls to secure the lid element to the housing part,
   the housing device further comprising a sealing element which can be elastically compressed between the housing part and the lid element when the housing part is connected to the lid element,
   wherein, when the housing part and the lid element are connected, the sealing element is elastically compressed between the housing part and the lid element to elastically connect the housing part and the lid element, and to seal the housing part and lid element against the entry of dirt and moisture into the housing part and lid element.

7. The housing device according to claim 6, wherein the plurality of lugs of the lid element are formed such that they each have a distal part, said distal part after bending being permanently arranged in the indentations of the housing part for establishing a form-fit connection.

8. The housing device according to claim 6, wherein an interior space for accommodating functional elements is formed between the lid element and the housing part, the functional elements comprising heat-emitting units which are pressed against the lid element for heat dissipation when the lid element and the housing part are in an assembled state.

9. A housing device for accommodating functional elements in the interior of the housing device, the housing device comprising:
   a housing part having one side provided with an opening for accommodating the functional elements;
   a lid element which can be connected to the housing part for closing the opening in the housing part, the lid element comprising a base plate on which a plurality of lugs are formed which extend from the base plate; and
   a sealing element which can be elastically compressed between the housing part and the lid element when the housing part is connected to the lid element, wherein
   the plurality of lugs are arranged on the base plate relative to the housing part in such a manner that the plurality of lugs, when the housing part and the lid element are connected, extend into indentations provided in sidewalls of the housing part after the plurality of lugs are plastically bent toward the housing part, to produce a firm and form-fitting connection between the housing part and the lid element,
   the sealing element being elastically compressed between the housing part and the lid element to elastically connect the housing part and the lid element, and to seal the housing part and lid element against the entry of dirt and moisture into the housing part and lid element.

10. The housing device according to claim 9, wherein the plastic bending of the plurality of lugs toward the housing part has the effect that the housing part rests against the sealing element and only partially compresses the sealing element to seal the housing part and lid element, without excessive stress on the sealing element.

* * * * *